(12) United States Patent
Siviero et al.

(10) Patent No.: US 11,967,384 B2
(45) Date of Patent: Apr. 23, 2024

(54) ALGORITHM QUALIFIER COMMANDS

(71) Applicant: Micron Technology, Inc., Boise, ID (US)

(72) Inventors: Anna Chiara Siviero, Albignasego (IT); Umberto Siciliani, Rubano (IT)

(73) Assignee: Micron Technology, Inc., Boise, ID (US)

(*) Notice: Subject to any disclaimer, the term of this patent is extended or adjusted under 35 U.S.C. 154(b) by 117 days.

(21) Appl. No.: 17/856,788

(22) Filed: Jul. 1, 2022

(65) Prior Publication Data

US 2024/0005996 A1    Jan. 4, 2024

(51) Int. Cl.
| | | |
|---|---|---|
| G11C 16/00 | (2006.01) |
| G11C 16/10 | (2006.01) |
| G11C 16/14 | (2006.01) |
| G11C 16/26 | (2006.01) |
| G11C 16/34 | (2006.01) |

(52) U.S. Cl.
CPC ............ *G11C 16/102* (2013.01); *G11C 16/14* (2013.01); *G11C 16/26* (2013.01); *G11C 16/3459* (2013.01)

(58) Field of Classification Search
CPC ..... G11C 16/10; G11C 16/0483; G11C 16/26; G11C 11/5628; G11C 11/5671; G11C 11/5642; G11C 16/3459; G11C 11/5635; G11C 16/0408; G11C 16/3418; G11C 2211/5641; G11C 7/04; G11C 16/0466; G11C 16/08; G11C 16/12; G11C 2029/0411; G11C 29/42; G11C 29/52; G11C 7/00; G11C 16/06; G11C 2207/2263; G11C 5/005; G11C 7/1006; G11C 16/16; G11C 16/30; G11C 16/349; G11C 11/4063; G11C 14/0018
See application file for complete search history.

(56) References Cited

U.S. PATENT DOCUMENTS

| | | | |
|---|---|---|---|
| 11,755,237 B2* | 9/2023 | Parry | G06F 3/0655 |
| | | | 711/154 |
| 2017/0322727 A1 | 11/2017 | Yeh | |
| 2018/0074708 A1 | 3/2018 | Gerhart et al. | |
| 2020/0104384 A1 | 4/2020 | Knierim et al. | |
| 2020/0393973 A1 | 12/2020 | Reusswig et al. | |

\* cited by examiner

*Primary Examiner* — Thong Q Le
(74) *Attorney, Agent, or Firm* — Brooks, Cameron & Huebsch, PLLC

(57) ABSTRACT

Apparatuses, systems, and methods for algorithm qualifier commands are described according to embodiments of the present disclosure. One example method can include executing an algorithm qualifier command on a memory device and performing an operation on the memory device for a command sequence that follows the algorithm qualifier command using a number of settings indicated by the algorithm qualifier command. The algorithm qualifier command can indicate a number of settings to use while performing the operation on the memory device.

20 Claims, 4 Drawing Sheets

| Program 250 | PRG1 252-1 | PRG2 252-2 | PRG3 252-3 | PRG4 252-4 |
| Read 254 | RD1 256-1 | RD2 256-2 | RD3 256-3 | RD4 256-4 |
| Erase 258 | ERS1 260-1 | ERS2 260-1 | ERS3 260-3 | ERS4 260-4 |
| iWL 261 | iWL1 262-1 | iWL2 262-2 | iWL3 262-3 | iWL4 262-4 |

FIG. 2

| 364-7 | 364-6 | 364-5 | 364-4 | 364-3 | 364-2 | 364-1 | 364-0 |
|---|---|---|---|---|---|---|---|
| Bit 7 | Bit 6 | Bit 5 | Bit 4 | Bit 3 | Bit 2 | Bit 1 | Bit 0 |
| CMD [7:0] 366 |||||||||

FIG. 3

ALGORITHM QUALIFIER COMMANDS

TECHNICAL FIELD

The present disclosure relates generally to printed circuit board assemblies, and more particularly, to apparatuses and methods for executing algorithm qualifier commands.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

BRIEF DESCRIPTION OF THE DRAWINGS

FIG. 2 illustrate example trim settings associated with algorithm qualifier operations in accordance with some embodiments of the present disclosure.

FIG. 3 illustrates an algorithm qualifier command in accordance with some embodiments of the present disclosure.

DETAILED DESCRIPTION

Figure 1:
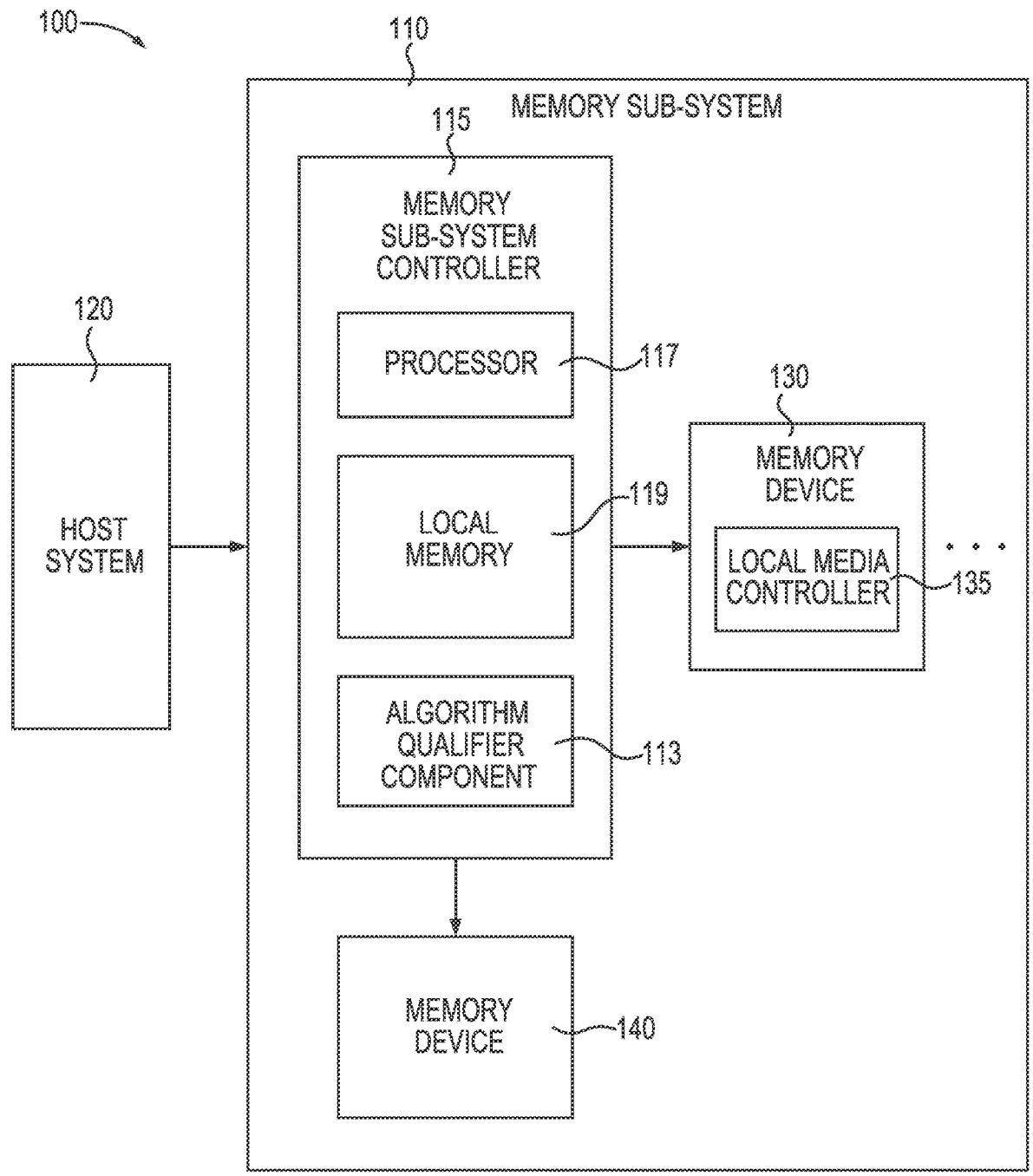
FIG. 1 illustrates an example computing system that includes a memory sub-system in accordance with some embodiments of the present disclosure.

Aspects of the present disclosure are directed to algorithm qualifier commands in a memory sub-system. One example method can include executing an algorithm qualifier command on a memory device and performing an operation on the memory device for a command sequence that follows the algorithm qualifier command using a number of algorithm options indicated by the algorithm qualifier command. The memory device can be configured to use a number of algorithms options that are indicated by the algorithm qualifier command while performing operations on the memory device. The algorithm qualifier command can indicate a number of algorithm options, such as trim settings to use while performing the operation on the memory device, performing half good block selections operations, coarse threshold estimate read operations, and/or on the fly soft bit management operations.

The algorithm qualifier command allows algorithm options to be selected before each operation performed by a memory device. For example, the algorithm qualifier command can also be used to select trim settings for a number of memory device operations that follow the algorithm qualifier command until another algorithm qualifier command is executed.

The algorithm qualifier command does not introduce additional latency while performing operations on the memory device and can be used with any memory device operation. The algorithm qualifier command can be used to select any number of trim settings that are stored on the memory device and the trim settings selected by the algorithm qualifier command that are stored on the memory device can be updated any time.

A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states, while a TLC can store multiple bits of information and has eight logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines. While both floating-gate architectures and replacement-gate architectures employ the use of select gates (e.g., select gate transistors), replacement-gate architectures can include multiple select gates coupled to a string of NAND memory cells. Further, replacement-gate architectures can include programmable select gates.

A memory device can include a number of types of memory cells, such as SLC, MLC, QLC and a memory device can be configured to switch between the types of memory device. A memory device can include memory cells with different architectures, such as floating-gate or replacement-gate. Also a memory device, and particularly during the life of a memory device that utilizes non-volatile memory technology, the memory cells of the memory device can experience threshold voltage shift. The threshold voltage shift can be dependent on the workload of the memory device and/or environmental conditions of the memory device. For example, the ability of the memory cells to retain data accurately and/or provide accurate data in response to receipt of a memory access request can decrease over time. Stated alternatively, NAND memory cells can generally only sustain a finite quantity of erase cycles before the memory cells begin to fail to accurately retain data and/or become unusable.

Due to a memory device having a number of different configurations including memory cell type and/or memory cell architecture, among others, and the memory device experiencing changes based on workload and/or environmental conditions of the memory device, it can be desirable to select or change the trim settings that are used to perform operations on the memory device.

Trim settings can include a number of parameters that can control the operation and performance of the memory device. For example, the trim settings can include parameters such as the programming signal magnitude (e.g., voltage and/or current level), erase signal magnitude (e.g., voltage and/or current level), sensing signal magnitude (e.g., voltage and/or current level), programming signal length, erase signal length, sensing signal length, number of bits per cells, number of programming signals in a programming operation, number of sensing signals in a sensing operation, and/or allowable programming operation rate for a memory device. Trim settings can include a number of settings for each of the number of parameters. The trim settings can control the operational characteristics of the memory device. The operational characteristics of the memory device can include life span of the memory device, data retention characteristics for the data in the memory device, the storage density (e.g., the number of bits stored) for the memory device, disturb characteristics for the data in the memory device, programming speed for the memory device, power consumption for the memory device, sensing speed for the memory device, operation temperature for the memory device, and/or programming operation rate for the memory device, among other operational characteristics.

In a number of embodiments, trim settings can include a number of configurations of trim setting parameters that can control the operational characteristics of the memory device. A trim setting configuration can include setting each of the number of trim setting parameters at particular levels to provide particular operational characteristics for memory device. A particular trim setting configuration can be associated with particular operational characteristics for a memory device. A trim setting configuration used to operate memory device can be based on desired operational characteristics for memory device, die info for the array, and/or metadata for the data in memory device.

For example, as described in more detail herein, embodiments of the present disclosure perform algorithm qualifier commands to select a number of algorithm options, such as trim settings to use while performing the operation on the memory device, settings for performing half good block selections operations, settings for coarse threshold estimate read operations, and/or settings for on the fly soft bit management operations, among other operations. The algorithm qualifier command can be used to select trim settings for any operations performed on a memory device, such as read operations, write operations, erase operations, program verify operations, among other types of operations. The algorithm qualifier command can be used to select options with different settings for performing the operation on the memory device, such as half good block selections operations, coarse threshold estimate read operations, and/or on the fly soft bit management operations, among other operations The algorithm qualifier command can include an address that indicates a location where the settings (e.g., trim settings, half good block selections settings, coarse threshold estimate read settings, and/or on the fly soft bit management settings) to be used by the memory device for operations on the memory device are stored. Executing the algorithm qualifier command can include locating the settings at the location indicated by the algorithm qualifier command and configuring the memory device to perform operations using the settings stored at the location indicated by the algorithm qualifier command.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 includes a processing device 121. The processing unit 121 can be a central processing unit (CPU) that is configured to execute an operating system. In some embodiments, the processing unit 121 comprises a complex instruction set computer architecture, such an x86 or other architecture suitable for use as a CPU for a host system 120.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random-access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAIVI (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can include an algorithm qualifier component 113. Although not shown in FIG. 1 so as to not obfuscate the drawings, the algorithm qualifier component 113 can include various circuitry to facilitate performance of algorithm qualifier commands to determine settings (e.g., trim settings, half good block selections settings, coarse threshold estimate read settings, and/or on the fly soft bit management settings) that are used with command sequences for performing operations on the memory device. The algorithm qualifier component 113 can execute algorithm qualifier commands. As described herein, the algorithm qualifier commands can be performed on memory devices at any time during processing stages or during user operation. The algorithm qualifier component 113 may be referred to herein in the alternative as a "controller," a "processing device," or a "processor," given the context of the disclosure.

Although the algorithm qualifier component 113 is illustrated as being resident on the memory sub-system controller 115, embodiments are not so limited. For example, the algorithm qualifier component 113 can be resident on the memory device 130 (e.g., resident on the local media controller), or can be resident on other component of the memory sub-system 110. As used herein, the term "resident on" refers to something that is physically located on a particular component. For example, the algorithm qualifier component 113 being "resident on" the memory sub-system controller 115 refers to a condition in which the hardware circuitry that comprises algorithm qualifier component 113 is physically located on the memory sub-system controller 115. The term "resident on" can be used interchangeably with other terms such as "deployed on" or "located on," herein.

In some embodiments, the memory sub-system controller 115 includes at least a portion of the algorithm qualifier component 113. For example, the memory sub-system controller 115 can include a processor 117 (processing device) configured to execute instructions stored in local memory 119 for performing the operations described herein. In some embodiments, algorithm qualifier component 113 is part of the host system 110, an application, or an operating system.

In some embodiments, the memory sub-system 110, and hence the algorithm qualifier component 113, can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

FIG. 2 illustrate example trim settings associated with algorithm qualifier operations in accordance with some embodiments of the present disclosure. The trim settings in FIG. 2 includes program operation trim settings 250, read operation trim settings 254, erase operation trim settings 258, and individual word line (iWL) operation trim settings 261. Embodiments of the present disclosure can include trim settings for any type of operation on a memory device, such as program verify, among other operations not illustrated in FIG. 2. FIG. 2 illustrates trim settings, but in other embodiments the settings can include trim settings, half good block selections settings, coarse threshold estimate read settings, and/or on the fly soft bit management settings, among other settings associated with various operations on the memory device.

The trim settings in FIG. 2 can be stored in the memory device, such as in the memory array and/or in a register on the memory device. The trim settings in FIG. 2 can include define the parameters of the trim settings that are used by the memory device to perform operations on the memory device. The algorithm qualifier command can include an address to location where the settings (e.g., trim settings, half good block selections settings, coarse threshold estimate read settings, and/or on the fly soft bit management settings) are stored in the memory device. For example, when the PRG1 trim setting 252-1 is desired, an algorithm qualifier command with an address to the location where PRG1 trim setting 252-1 is located will be executed. The trim settings at the location for PRG1 trim setting 252-1 will be accessed and used to perform the operation on the memory device.

FIG. 2 illustrates 16 trim settings including 4 program operation trim settings, 4 read operation trim settings, 4 erase operation trim settings, and 4 iWL operation trim settings. Embodiments of the present disclosure can include any number of settings e.g., trim settings, half good block selections settings, coarse threshold estimate read settings, and/or on the fly soft bit management settings). For example, an algorithm qualifier command can include by 1 byte address allowing the 1-byte address to be associated with $2^8$ different trim settings. The algorithm qualifier command can be extensible to any number of bytes or bits, allowing the algorithm qualifier command to be associated with any number of settings.

The program operation trim settings 250 includes PRG1 trim settings 252-1, PRG2 trim settings 252-2, PRG3 trim settings 252-3, and PRG4 trim settings 252-4. The program operation trim settings 250 can be used by executing an algorithm qualifier command having an address of the location in the memory device of one of PRG1 trim settings 252-1, PRG2 trim settings 252-2, PRG3 trim settings 252-3, and PRG4 trim settings 252-4.

The read operation trim settings 254 includes RD1 trim settings 256-1, RD2 trim settings 256-2, RD3 trim settings 256-3, and RD4 trim settings 256-4. The read operation trim settings 254 can be used by executing an algorithm qualifier command having an address of the location in the memory device of one of RD1 trim settings 256-1, RD2 trim settings 256-2, RD3 trim settings 256-3, and RD4 trim settings 256-4.

The erase operation trim settings 258 includes ERS1 trim settings 260-1, ERS2 trim settings 260-2, ERS3 trim settings 260-3, and ERS4 trim settings 260-4. The erase operation trim settings 258 can be used by executing an algorithm qualifier command having an address of the location in the memory device of one of ERS1 trim settings 260-1, ERS2 trim settings 260-2, ERS3 trim settings 260-3, and ERS4 trim settings 260-4.

The iWL operation trim settings 261 includes iWL1 trim settings 262-1, iWL2 trim settings 262-2, iWL3 trim settings 262-3, and iWL4 trim settings 262-4. The iWL operation trim settings 261 can be used by executing an algorithm qualifier command having an address of the location in the memory device of one of iWL1 trim settings 262-1, iWL2 trim settings 262-2, iWL3 trim settings 262-3, and iWL4 trim settings 262-4.

FIG. 3 illustrates an algorithm qualifier command in accordance with some embodiments of the present disclosure. The algorithm qualifier command 366 in FIG. 3 includes 8 bits. The 8 bits of the algorithm qualifier command 366 can indicate an address in the memory device (e.g., a location the memory arrays or registers of the memory device) where the settings (e.g., trim settings, half good block selections settings, coarse threshold estimate read settings, and/or on the fly soft bit management settings) are located. The algorithm qualifier command 366 can be executed to locate and obtain the settings for the memory device to use for a number of commands associated with memory device operations that follow the algorithm qualifier command.

In FIG. 3, the algorithm qualifier command 366 includes 8 address bits, Bit 0, 364-0, Bit 1 362-1, Bit 2 364-2, Bit 3 362-3, Bit 4 364-4, Bit 5 364-6, Bit 6 364-6, and Bit 7 364-7. The bits of the algorithm qualifier command 366 can be an address of a location in the memory device and can be executed to by the memory device to obtain the settings (e.g., trim settings, half good block selections settings, coarse threshold estimate read settings, and/or on the fly soft bit management settings) to perform operations on the memory device. In a number of embodiments, the algorithm qualifier command 366 can include any number of bits, such that the algorithm qualifier command can be used to locate any number of trim settings. For example, the 8 bits of algorithm qualifier command 366 can be used to locate $2^8$ different trim settings, while an algorithm qualifier command with 16 bits can be used to locate $2^{16}$ different trim settings.

Figure 4A:
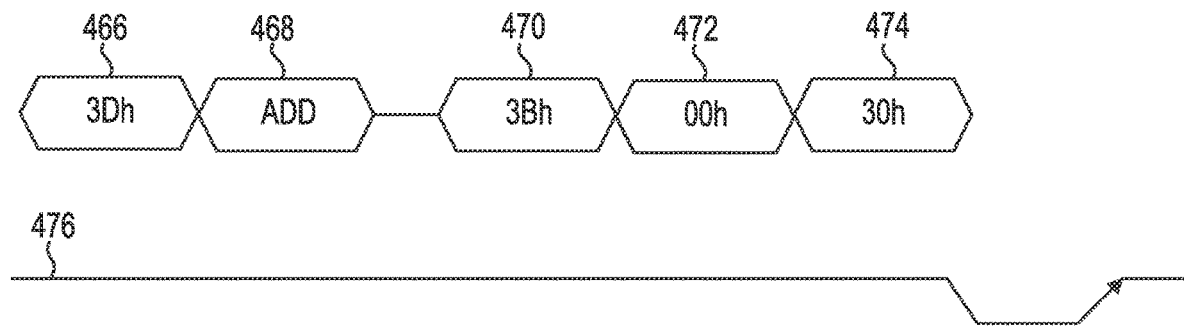
FIGS. 4A-4C illustrate methods for performing an algorithm qualifier operation in accordance with a number of embodiments of the present disclosure.
Figure 4B:
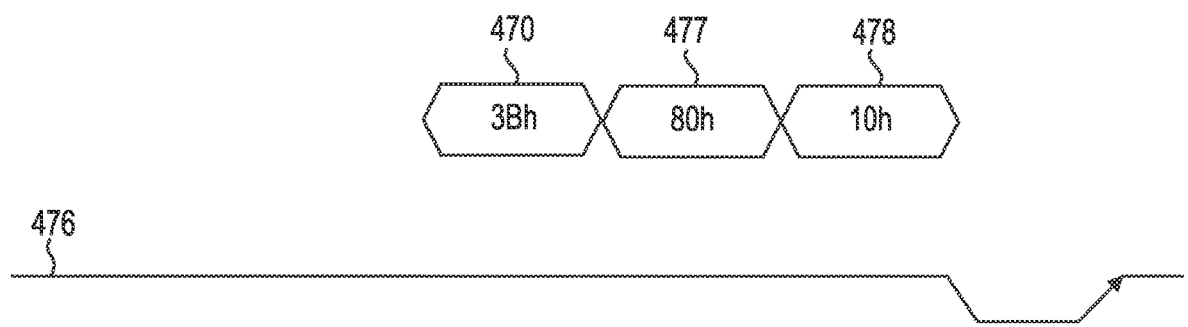
Figure 4C:
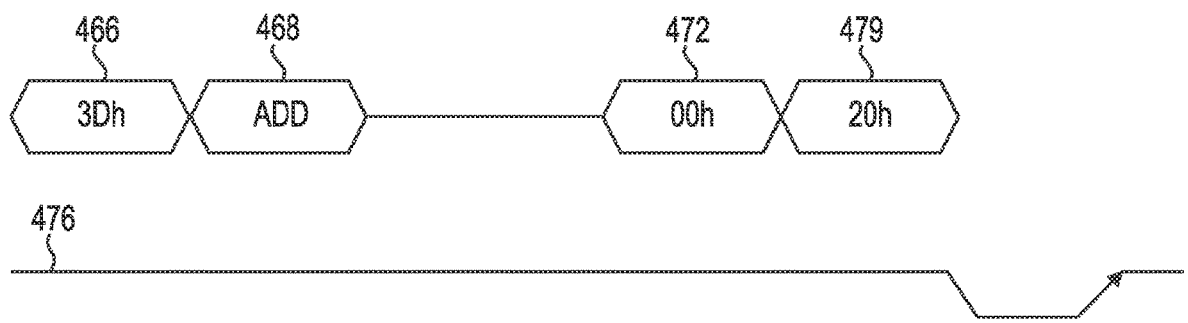

FIGS. 4A-4C illustrate methods for performing an algorithm qualifier operation in accordance with a number of embodiments of the present disclosure. In FIG. 4A, algorithm command 466 (3Dh) along with the address bit for the command 468 (ADD) are received and executed. The settings (e.g., trim settings, half good block selections settings, coarse threshold estimate read settings, and/or on the fly soft bit management settings) at the location in the memory device indicated by the ADD 468 are obtained by the memory device. The settings indicated by algorithm qualifier command 466 are then used to perform the operations indicated by the command sequence 3Bh 470, 00h 472, and 30h 474 that follow the algorithm qualifier command 466. Ready signal 476 can be used to indicate that the operations on the memory device associated with the command sequence 3Bh 470, 00h 472, and 30h 474 are complete. Algorithm qualifier command 466 can be preceded or followed by a LUN, plane, and/or die indicator (not shown) such as a select command (e.g., a LUN, plane, and or/die select command). Algorithm qualifier commands that are preceded or are followed by a LUN, plane and/or die indicator can be standalone algorithm qualifier commands where the setting is used on all commands that follow the algorithm qualifier command until another algorithm qualifier command is received and executed.

In FIG. 4B, command sequence 38h 470, 80h 577, and 10h 478 is received by the memory device. This command sequence follows the command sequence shown in FIG. 4B without any intervening algorithm qualifier command and the algorithm qualifier command 466 in FIG. 4A was a standalone qualifier command, therefore the command sequence 38h 470, 80h 577, and 10h 478 in FIG. 4B is performed using the settings indicated by the algorithm qualifier command 466 in FIG. 4A. Ready signal 476 can be used to indicate that the operations on the memory device associated with command sequence 38h 470, 80h 577, and 10h 478 are complete.

In FIG. 4C, algorithm command 466 (3Dh) along with the address bit for the command 468 (ADD) are received and executed. The settings at the location in the memory device indicated by the ADD 468 are obtained by the memory device. The settings indicated by algorithm qualifier command 466 are then used to perform the operations indicated by the command sequence 00h 472 and 20h 479 that follow the algorithm qualifier command 466. Ready signal 476 can be used to indicate that the operations on the memory device associated with the command sequence 00h 472 and 20h 479 are complete. Algorithm qualifier command 466 in FIG. 4C can be a prefix algorithm qualifier command. Prefix algorithm qualifier commands are associated with only the command sequence that follows the prefix algorithm qualifier command. LUN, plane, and/or die indicators are not needed for prefix algorithm qualifier commands and do not precede or follow the prefix algorithm qualifier command. The ready signal indicates that the program operation associated with the command sequence that follows the prefix algorithm qualifier command is complete and that another algorithm qualifier command, is ready to be received. Prefix and standalone algorithm qualifier commands are mutually exclusive and a memory device can be configured to execute prefix algorithm qualifier commands or can be configured to execute standalone algorithm qualifier commands.

Figure 5:
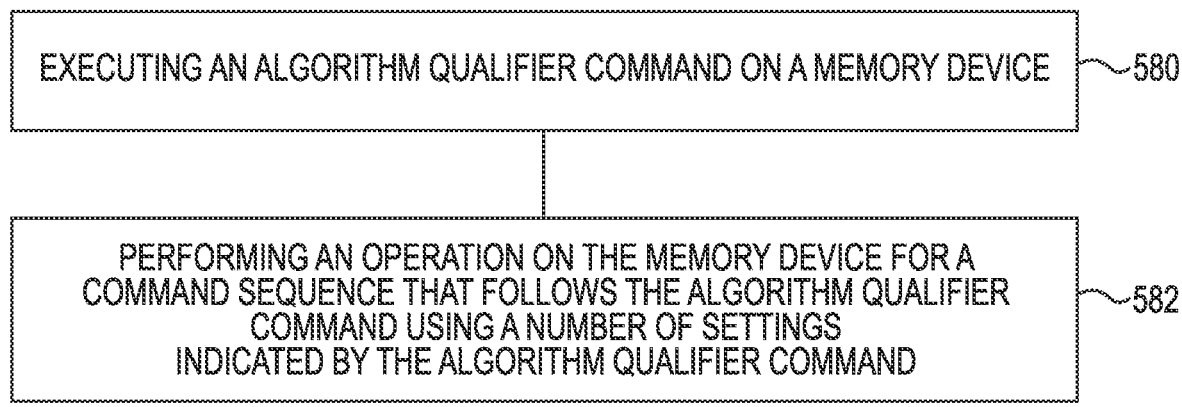
FIG. 5 is a method flow diagram illustrating an example algorithm qualifier operation in accordance with a number of embodiments of the present disclosure.

FIG. 5 is a method flow diagram illustrating an example algorithm qualifier operation in accordance with a number of embodiments of the present disclosure. At 580, the method includes executing an algorithm qualifier command on a memory device. At 582, the method includes performing an operation on the memory device for a command sequence that follows the algorithm qualifier command using a number of settings indicated by the algorithm qualifier command.

In a number of embodiments, the algorithm qualifier command indicates the number of settings to use while performing the operation on the memory device. The algorithm qualifier command indicates the number of settings for a read operation, a write operation, an erase operation, among other types of operations.

The method can include executing the algorithm qualifier command to locate the number of settings (e.g., trim settings, half good block selections settings, coarse threshold estimate read settings, and/or on the fly soft bit management settings) at an address indicated by the algorithm qualifier command. The method can include performing the operation on a portion of the memory device indicated by a select command (e.g., a LUN, plane, and or/die select command) that precedes executing the algorithm qualifier command. The method can also include performing additional operations on the memory device with the number of settings indicated by the algorithm qualifier command until another algorithm qualifier command is executed by the memory device.

In a number of embodiments, a method can include executing a first algorithm qualifier command on a memory device, performing a first operation on the memory device using a first number of settings indicated by the first algorithm qualifier command, executing a second algorithm qualifier command on the memory device, and performing a second operation on the memory device using a second number of settings indicated by the second algorithm qualifier command.

The method can include performing the first operation includes performing a program verify operation on a first portion of data and performing the second operation incudes performing a read operation on the first portion of data. The second algorithm command can be executed in response to a ready signal indication. The ready signal can be used to indicate that the first operation is complete that the second algorithm command is ready for execution to change the settings that will be used for the second operation.

The method can include locating the first set of settings stored at a first address in the memory device or a register indicated by the first algorithm qualifier command and locating the second set of settings stored at a second address in the memory device or a register indicated by the second algorithm qualifier command.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
   executing an algorithm qualifier command on a memory device; and
   performing an operation on the memory device for a command sequence that follows the algorithm qualifier command using a number of settings indicated by the algorithm qualifier command.

2. The method of claim 1, wherein the algorithm qualifier command indicates the number of settings to use while performing the operation on the memory device.

3. The method of claim 1, wherein the algorithm qualifier command indicates the number of settings for a read operation.

4. The method of claim 1, wherein the algorithm qualifier command indicates the number of settings for a write operation.

5. The method of claim 1 wherein the algorithm qualifier command indicates the number of settings for an erase operation.

6. The method of claim 1, wherein executing the algorithm qualifier command includes locating the number of settings at an address indicated by the algorithm qualifier command.

7. The method of claim 1, further including performing the operation on a portion of the memory device indicated by a select command that precedes executing the algorithm qualifier command.

8. The method of claim 1, further including performing additional operations on the memory device with the number of settings indicated by the algorithm qualifier command until another algorithm qualifier command is executed by the memory device.

9. A method, comprising:
   executing a first algorithm qualifier command on a memory device;
   performing a first operation on the memory device using a first number of settings indicated by the first algorithm qualifier command;
   executing a second algorithm qualifier command on the memory device; and
   performing a second operation on the memory device using a second number of settings indicated by the second algorithm qualifier command.

10. The method of claim 9, wherein performing the first operation includes performing a program verify operation on a first portion of data.

11. The method of claim 10, wherein performing the second operation incudes performing a read operation on the first portion of data.

12. The method of claim 9, further including locating the first set of settings stored at a first address in the memory device or a register indicated by the first algorithm qualifier command.

13. The method of claim 9, further including locating the second set of settings stored at a second address in the memory device or a register indicated by the second algorithm qualifier command.

14. The method of claim 9, further including executing a third algorithm qualifier command on the memory device and performing a third operation on the memory device using a third number of settings indicated by the third algorithm qualifier command.

15. The method of claim 9, further including executing the second algorithm command in response to a ready signal indication.

16. An apparatus, comprising:
- a memory device; and
- a controller couplable to the memory device, wherein the controller is configured to:
- execute an algorithm qualifier command that indicates a number of settings; and
- perform a number of commands on the memory device using the number of settings indicated by the algorithm qualifier command.

17. The apparatus of claim 16, wherein the number of settings are stored in the memory device or in a register.

18. The apparatus of claim 16, wherein the algorithm qualifier command includes an address that indicates a location in the memory device or a register where the number of settings are stored.

19. The apparatus of claim 16, wherein the algorithm qualifier command is executed without adding latency to performing the number of commands.

20. The apparatus of claim 16, wherein the number of commands include read, command, write command, erase commands, and program verify commands.

* * * * *